United States Patent
Kizilyalli et al.

(10) Patent No.: US 6,174,807 B1
(45) Date of Patent: Jan. 16, 2001

(54) METHOD OF CONTROLLING GATE DOPANT PENETRATION AND DIFFUSION IN A SEMICONDUCTOR DEVICE

(75) Inventors: Isik C. Kizilyalli; Joseph Rudolph Radosevich, both of Orlando, FL (US)

(73) Assignee: Lucent Technologies, Inc., Murray Hill, NJ (US)

(*) Notice: Under 35 U.S.C. 154(b), the term of this patent shall be extended for 0 days.

(21) Appl. No.: 09/260,947

(22) Filed: Mar. 2, 1999

(51) Int. Cl.[7] .................................................. H01L 21/44
(52) U.S. Cl. .......................... 438/655; 438/369; 438/532; 438/542; 438/592; 438/621; 438/659
(58) Field of Search ........................... 438/22, 223, 224, 438/369, 370, 532, 542, 546, 592, 621, 648, 663, 655, 659, 660; 257/755

(56) References Cited

U.S. PATENT DOCUMENTS

| | | | |
|---|---|---|---|
| 3,964,941 | * 6/1976 | Wang | 438/223 |
| 4,435,896 | * 3/1984 | Parrillo et al. | 438/217 |
| 4,554,726 | * 11/1985 | Hilllenius et al. | 438/228 |
| 4,851,257 | * 7/1989 | Young et al. | 438/618 |
| 5,278,096 | * 1/1994 | Lee et al. | 438/592 |
| 5,837,601 | * 11/1998 | Matsumoto | 438/592 |
| 5,851,922 | * 12/1998 | Bevk et al. | 438/655 |

* cited by examiner

Primary Examiner—Carl Whitehead, Jr.
Assistant Examiner—Maria Guerrero
(74) Attorney, Agent, or Firm—Stroock & Stroock & Lavan LLP

(57) ABSTRACT

A method of forming a multi-layered dual-doped polysilicon structure that minimizes Boron penetration into the n+ polysilicon during formation of the p+ polysilicon. The method of the present invention also reduces the migration of Boron (p+ gate dopant) from the p+ polysilicon and the migration of Arsenic and/or Phosphorous (n+ gate dopant) from the n+ polysilicon during subsequent fabrication processing steps. The present invention is also directed to a semiconductor device having a gate dopant barrier that minimizes gate dopant penetration and migration.

13 Claims, 2 Drawing Sheets

METHOD OF CONTROLLING GATE DOPANT PENETRATION AND DIFFUSION IN A SEMICONDUCTOR DEVICE

FIELD OF THE INVENTION

The present invention relates to integrated circuits and. more particularly, to a method of controlling gate dopant penetration and diffusion in a multi-layered dual-doped polysilicon structure and in CMOS devices fabricated therefrom.

BACKGROUND OF THE INVENTION

Gate dopant penetration and lateral diffusion in a multi-layered dual-doped polysilicon structure adversely affects the fabrication yield and the performance of integrated circuits constructed from such structures. To prevent gate dopant penetration during formation of n+ and p+ polysilicon gates, two photoresist masks are typically applied and removed at different stages of the fabrication process which, of course, increases the expense of the fabrication process. While the thermal budget (i.e., the temperature and time fabrication parameters) may be reduced to limit the amount of dopant penetration, reducing lateral diffusion of gate dopants during subsequent processing steps, i.e., steps performed after the n+ and p+ polysilicon gates have been formed, presents a more vexing problem. Although some Boron diffusion may be acceptable, it is desirable to minimize the amount so that the performance of the semiconductor device manufactured from the structure is not adversely effected (i.e., too much Boron diffusion will change the characteristics of the n+ type polysilicon and hence the NMOS device (transistor)). Here too the thermal budget may be reduced to address gate dopant diffusion. In addition, Tungsten-Silicide or Tungsten alone may be eliminated from the structure. However, this results in a high gate sheet resistance.

There thus exists a need in the art for a method of fabricating a multi-layered dual-doped polysilicon structure that overcomes the above-described shortcomings of the prior art.

SUMMARY OF THE INVENTION

The present invention is directed to a method of forming a multi-layered dual-doped polysilicon structure that minimizes Boron penetration into the n+ polysilicon during formation of the p+ polysilicon. The method of the present invention also reduces the migration of Boron (p+ gate dopant) from the p+ polysilicon and the migration of Arsenic and/or Phosphorous (n+ gate dopant) from the n+ polysilicon during subsequent fabrication processing steps. The present invention is also directed to a semiconductor device having a gate dopant barrier that minimizes gate dopant penetration and migration.

In accordance with the method of the present invention, a multi-layered structure having an n-tub region and a p-tub region in a substrate and a polysilicon layer disposed thereabove is formed by applying a gate dopant mask over the polysilicon layer above the n-tub region. N+ polysilicon is formed by introducing n+ gate dopant into the unmasked polysilicon layer above the p-tub region of the substrate. A gate dopant barrier is formed by implanting Nitrogen into the polysilicon layer to form a Nitrogen-rich region above the p-tub region (into the n+ polysilicon). The barrier blocks penetration of p+ gate dopant into the n+ polysilicon during formation of the p+ polysilicon. Thereafter, the gate dopant mask is removed and a meta-lsilicide is applied over the polysilicon layer. A p+ gate dopant is introduced into the metal-silicide and the structure is exposed to a rapid thermal anneal process to drive the p+ gate dopant into the polysilicon layer above the n-tub region of the substrate, i.e. to form p+ polysilicon in the polysilicon layer above the n-tub region. The n+ gate dopant may be Arsenic and/or Phosphorous, and the p+ gate dopant is preferably Boron.

The semiconductor device of the present invention includes a multi-lavered structure having an n-tub region and a p-tub region in a substrate and a polysilicon layer disposed thereabove. N+ polysilicon is defined in the polysilicon layer above the p-tub region, and p+ polysilicon is defined in the polysilicon layer above the n-tub region. A gate dopant barrier implanted in the polysilicon above the p-tub region (in the n+ polysilicon) minimizes introduction of p+ gate dopant into the n+ polysilicon gate during formation of the p+ polysilicon. The barrier also reduces p+ gate dopant (Boron) and n+ gate dopant (Arsenic or Phosphorous) migration during fabrication of the semiconductor device.

Other objects and features of the present invention will become apparent from the following detailed description. considered in conjunction with the accompanying drawing figures. It is to be understood, however, that the drawings, which are not to scale, are designed solely for the purpose of illustration and not as a definition ot the limits of the invention, for which reference should be made to the appended claims.

BRIEF DESCRIPTION OF THE DRAWINGS

In the drawing figures, which are not to scale, and which are merely illustrative. and wherein like reference characters denote similar elements throughout the several views.

DETAILED DESCRIPTION OF THE PRESENTLY PREFERRED EMBODIMENTS

Figure 1:
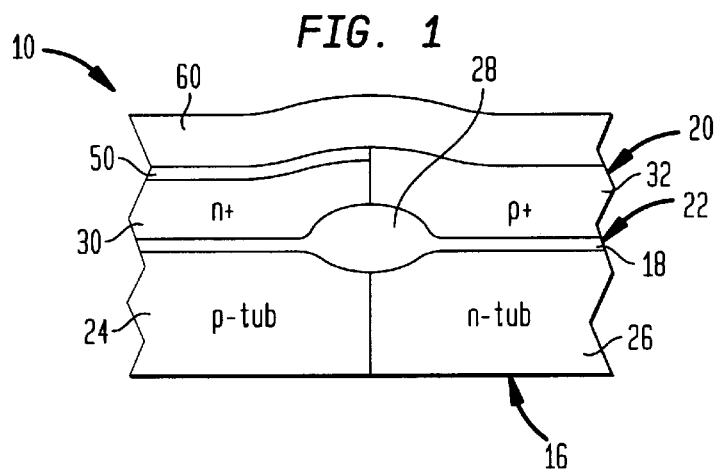
FIGS. 1–4 depict a multi-layered dual-doped polysilicon structure constructed in accordance with the method of the present invention.

Referring now to the drawings in detail, FIGS. 1–4 depict a multi-layered dual-doped polysilicon structure 10 constructed in accordance with the present invention. The structure 10 includes a silicon substrate 16 having a p-tub region 24 and an n-tub region 26 defined therein. Formation of the p-tub and n-tub regions 24, 26 is accomplished using known processes and techniques, and is therefor not discussed in detail herein. Disposed above the substrate 16 is a Silicon-Dioxide ($SiO_2$) layer 22 comprising a gate oxide region 18 and a thicker field oxide region 28 that prevents conduction between unrelated transistors (sources and drains). Above the Silicon-Dioxide layer 22 is a dual-doped polysilicon layer 20 having n+ polysilicon 30 located above the p-tub region 24 and p+ polysilicon 32 located above the n-tub region 26. Disposed within the polysilicon above the p-tub region 24 (in the n+ polysilicon 30) is a gate dopant barrier 50 that retards gate dopant (Boron and Arsenic or Phosphorous) penetration and diffusion during subsequent fabrication steps. Barrier 50 is preferably a Nitrogen-rich region of the polysilicon, although other materials having similar barrier properties may be used, if appropriate, as a matter of application specific design choice. For example, an Argon-rich region may also be a suitable barrier. The structure 10 includes a layer of metal-silicide 60 above the dual-doped polysilicon layer 20. The metal-silicide is preferable Tungsten-Silicide, and may alternatively be Titanium-Silicide. Tantalum-Silicide or Cobalt-Silicide. Although gate dopant barrier 50 is depicted in the drawings and discussed as a separate and discrete layer. such depiction is for clarity and ease of discussion. Gate dopant barrier 50 is preferably comprised of Nitrogen implanted into and concentrated near the surface of the polysilicon layer 20 above the p-tub region 24. The amount of Nitrogen implanted into the polysilicon layer 20 to form the gate dopant barrier 50 depends, in part, on the specific semiconductor processing steps. For example, greater or lesser amounts of Nitrogen may be required depending on the specific processing steps that follow introduction of the Nitrogen into the polysilicon layer 20. However, the amount of Nitrogen implanted to form the gate dopant barrier 50 should be sufficient to restrict Boron penetration into n+ polysilicon 30 in quantities that would tend to adversely affect the operational characteristics of the semiconductor device.

As used herein, the barrier or retardant properties of the barrier 50 refers to its ability to minimize the movement of impurities (such as, for example, gate dopant) between polysilicon regions of the structure 10 which will adversely affect the operational characteristics of the semiconductor device. While it is desirable to control and perhaps block the introduction of certain impurities into certain part of the structure 10 during its formation, it will be obvious to persons skilled in the art that some amount of impurities may be acceptable in certain applications. For example, a small amount of Boron lateral diffusion from the p+ polysilicon 32 may be acceptable. The present invention minimizes or eliminates Boron penetration into p-tub region 26. The present invention also retards Boron and Arsenic or Phosphorous lateral diffusion, and in some cases, may eliminate diffusion paths for these elements that exist in prior art methods and devices. Thus, the present invention greatly improves the ability to perform subsequent processing steps (e.g., annealing) while reducing the deleterious effects of gate dopant migration.

The present invention is applicable generally to dual-doped polysilicon semiconductor devices, and preferably to CMOS devices (as discussed in further detail below). As used herein, the term dual-doped polysilicon refers to a semiconductor device having both n+ type and p+ type polysilicon.

Figure 2:
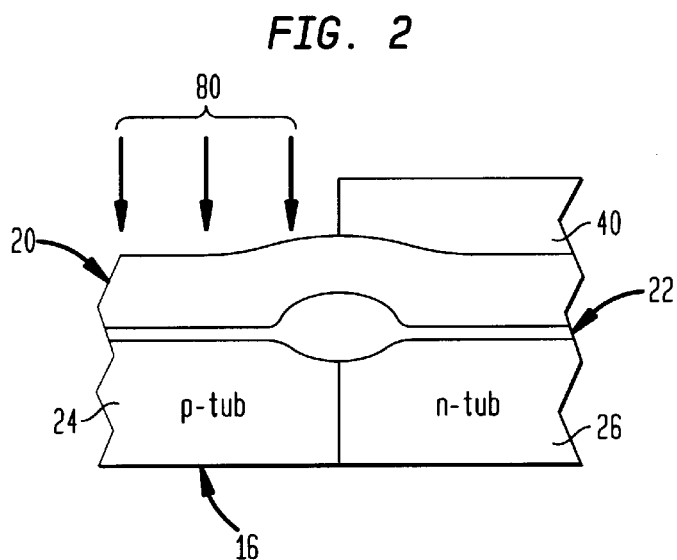
Figure 3:
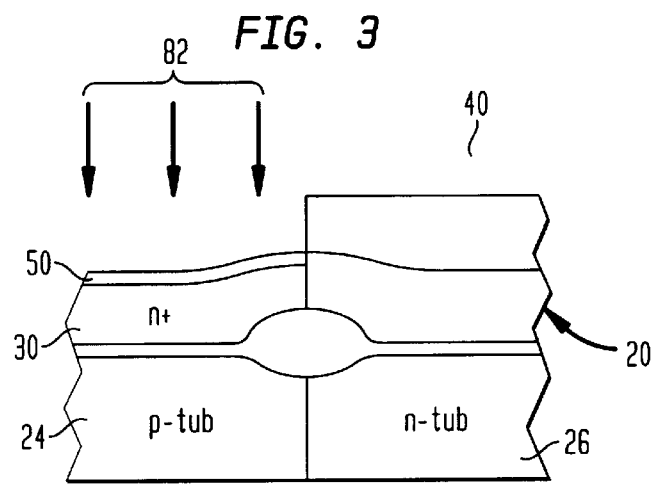

Referring now to FIG. 2, a photoresist mask 40 is applied above the polysilicon layer 20 (which, at his point, is undoped). The mask 40 prevents penetration of n+ gate dopant into the polysilicon above the n-tub region 26 during formation of the n+ polysilicon 30. To form the n+ polysilicon 30 above the p-tub region 24, the polysilicon layer 20 is doped with n+ gate dopant 80 such as, for example, Arsenic or Phosphorous. After the n+ polysilicon 30 has been formed, Nitrogen 82 is implanted into the n+ polysilicon 30 (FIG. 3) to create a Nitrogen-rich late dopant barrier 50 and the photoresist mask 40 is removed. The gate dopant barrier 50 prevents introduction of Boron (p+ gate dopant) into the n+ polysilicon 30 from the metal-silicide layer 60 during formation of the p+ polysilicon 32. The barrier 50 also reduce diffusion of Boron from the p+ polysilicon 32 into the n+ polysilicon 30, and diffusion of Arsenic (if provided) from the n+ polysilicon 30 into the p+ polysilicon 32.

Figure 4:
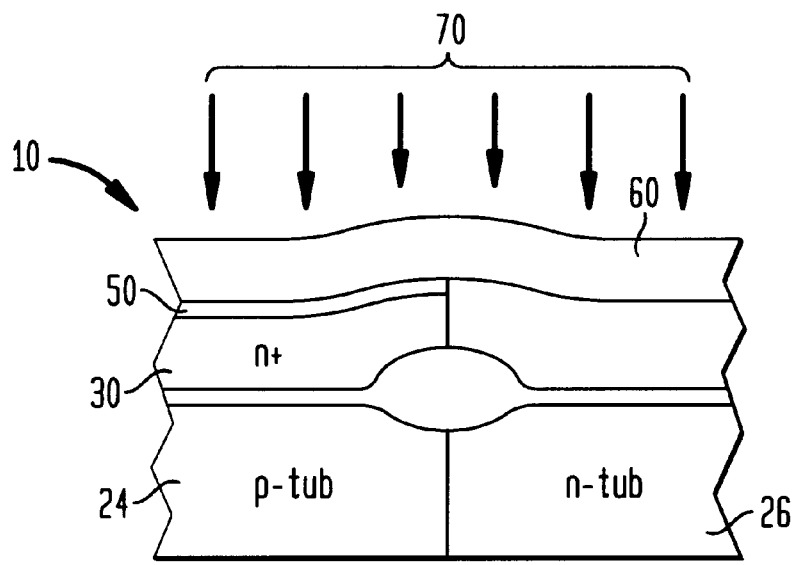

Referring next to FIG. 4, a metal-silicide layer 60, preferably Tungstein-Silicide, is deposited over the polysilicon layer 20, and a p+ gate dopant 70, preferably Boron, is implanted over the entire structure 10 without the need to mask the n+ polysilicon 30 (as in prior art methods and devices). The structure 10 is then thermally treated such as, for example, by rapid thermal annealing (or other similar thermal processes) to drive the Boron into the structure 10 and form p+ polysilicon 32. The gate dopant barrier 50 prevents penetration of Boron into the previously formed n+ polysilicon 30 without the need to mask this region of the structure 10.

Figure 5:
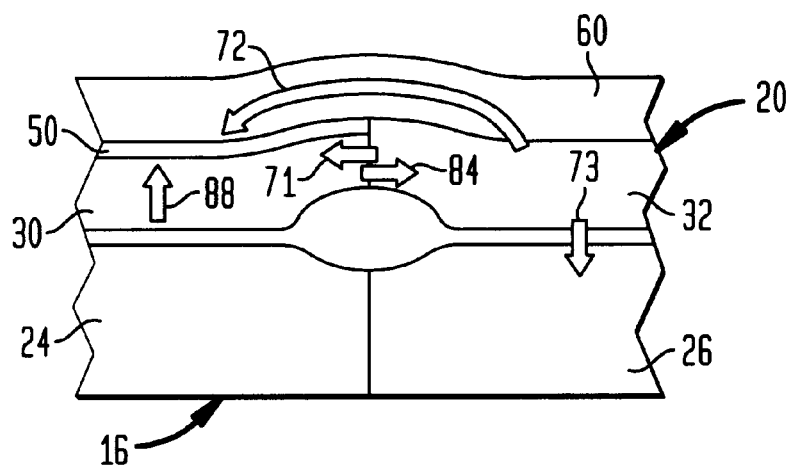
FIG. 5 is a diagrammatic representation depicting the effect on lateral cross-diffusion of p+ gate dopant and n+ gate dopant in a dual-doped polysilicon semiconductor device constructed in accordance with the present invention.

Gate dopant barrier 50 also reduces the migration of Boron from the p+ polysilicon 32 and the migration of Arsenic or Phosphorous from the n+ polysilicon 30 during subsequent fabrication processing steps (e.g., additional heating and/or annealing). As depicted diagrammatically in FIG. 5, a certain amount of Boron diffusion, indicated by the arrows labeled 71, 72, 73, will occur as the multi-layered structure 10 is being fabricated. For example, Boron will diffuse from the p+ polysilicon 32 directly into the adjacent n+ polysilicon 30 over a lateral diffusion path 71. Boron will also be caused to diffuse from the p+ polysilicon 32 into the silicon layer 16 over diffusion path 73. Finally, Boron will diffuse from the p+ polysilicon 32 into the n+ polysilicon 30 through the metal-silicide layer 60 over diffusion path 72; this path being the path over which the greatest amount of Boron is diffused. Too much diffusion will adversely effect the operation of the n+ polysilicon 30, to the point where the structure 10 may be rendered useless for forming integrated circuits and other semiconductor devices. The present invention minimizes or blocks Boron diffusion through the metal-silicide layer 60 over path 72 and thus practically eliminates the largest source of gate dopant migration or diffusion (i.e., path 72).

When the gate dopant barrier 50 is a Nitrogen-rich region, it will also minimize or block migration or diffusion of Arsenic and/or Phosphorous from the n+ polysilicon 30 into the p+ polysilicon 32 over path 88.

Boron diffusion may also be controlled by varying the heating parameters of the fabrication process. For example, reduced temperature may be used to control lateral diffusion of dopants (such as Boron, for example). In general, however, longer temperature exposure will increase the amount of dopant diffusion. By reducing or eliminating the major diffusion path for Boron through the metal-silicide layer 60, the present invention permits exposure to higher temperatures or prolonged temperature exposure during fabrication and/or subsequent processing, without sacrificing device yield and performance.

The method of the present invention is particularly well-suited for fabrication of semiconductor devices. These include, by way of non-limiting example CMOS devices such as memory devices including Dynamic Random Access Memorn (DRAM) and Static Random Access Memory (SRAM), microprocessors, Application Specific Integrated Circuits (ASICs), analog integrated circuits, and Digital Signal Processors (DSPs). The present invention may also be used to fabricate diodes, Silicon Controlled Rectifiers (SCRs), and other semiconductor devices having both n-type and p-type components.

The method of the present invention eliminates one photoresist mask from the fabrication process of a multi-layered, dual-doped polysilicon structure and thereby provides a more economical process for the fabrication of dual-doped polysilicon semiconductor devices. Moreover, no special gate oxide is required to produce dual-doped polysilicon semiconductor devices, as is the case with prior art methods. In addition, the fabrication parameters for the heating and annealing process steps are not subject to rigid time and temperature constraints because the method of the present invention reduces the amount of dopant diffusion resulting from exposure of the semiconductor device to temperature.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A method of forming a multi-layered semiconductor structure having an n-tub region and a p-tub region in a substrate and a polysilicon layer disposed thereabove, said method comprising the steps of:
   (a) applying a gate dopant mask over the polysilicon layer above the n-tub region of the substrate;
   (b) forming n+ polysilicon in the polysilicon layer above the p-tub region of the substrate;
   (c) forming a p+ gate dopant barrier in the n+ polysilicon;
   (d) removing the gate dopant mask applied in said step (a);
   (e) applying a metal-silicide over the polysilicon layer;
   (f) introducing a p+ gate dopant into the metal-silicide, said p+ gate dopant barrier minimizing p+ gate dopant penetration into the n+ polysilicon during said introduction of p+ gate dopant into the metal silicide; and
   (g) forming p+ polysilicon in the polysilicon layer above the n-tub region of the substrate by driving said p+ gate dopant from the metal-silicide into the polysilicon layer above the n-tub region of the substrate.

2. The method of claim 1, wherein said step (b) comprises introducing Arsenic into the polysilicon layer above the p-tub region.

3. The method of claim 1, wherein said step (b) comprises introducing Phosphorous into the polysilicon layer above p-tub region.

4. The method of claim 1, wherein said step (b) comprises introducing Arsenic and Phosphorous into the polysilicon layer above p-tub region.

5. The method of claim 1, wherein said step (c) comprises introducing Nitrogen into the n+ polysilicon.

6. The method of claim 1, wherein said step (f) comprises introducing Boron into the metal-silicide.

7. The method of claim 1, wherein said step (g) comprises exposing the multi-layered structure to a rapid thermal anneal process.

8. The method of claim 1, wherein said step (e) comprises applying Tungstein-Silicide over the polysilicon layer.

9. The method of claim 1, wherein said step (e) comprises applying Tantalum-Silicide over the polysilicon layer.

10. The method of claim 1, wherein said step (e) comprises applying Titanium-Silicide over the polysilicon layer.

11. The method of claim 1 wherein said step (e) comprises applying Cobalt-Silicide over the polysilicon layer.

12. A method of forming a multi-layered semiconductor structure having an n-tub region and a p-tub region in a substrate and a dual-doped polysilicon layer disposed thereabove and having n+ polysilicon and p+ polysilicon, said method comprising the step of forming a p+ gate dopant barrier in the polysilicon layer disposed above the p-tub region of the substrate to minimize p+ gate dopant penetration into the n+ polysilicon during formation of the p+ polysilicon.

13. The method of claim 12, wherein said step of step of forming a p+ gate dopant barrier comprises introducing Nitrogen into the polysilicon layer.

* * * * *